US010425091B2

(12) United States Patent
Jain et al.

(10) Patent No.: US 10,425,091 B2
(45) Date of Patent: Sep. 24, 2019

(54) FRACTIONAL CLOCK GENERATOR

(71) Applicant: TEXAS INSTRUMENTS INCORPORATED, Dallas, TX (US)

(72) Inventors: Dinesh Jain, Bengaluru (IN); Markus Friedrich Dietl, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/151,752

(22) Filed: Oct. 4, 2018

(65) Prior Publication Data

US 2019/0131983 A1 May 2, 2019

(30) Foreign Application Priority Data

Oct. 31, 2017 (IN) .............................. 201741038586

(51) Int. Cl.
*H03L 7/06* (2006.01)
*H03L 7/197* (2006.01)
*H03K 23/68* (2006.01)

(52) U.S. Cl.
CPC ........... *H03L 7/1976* (2013.01); *H03K 23/68* (2013.01)

(58) Field of Classification Search
USPC ................................ 327/147–149, 156–158
See application file for complete search history.

(56) References Cited

U.S. PATENT DOCUMENTS 5,191,295 A * 3/1993 Necoechea ........ G01R 31/2846
327/158
5,614,855 A * 3/1997 Lee ....................... H03L 7/0812
327/156

(Continued)

FOREIGN PATENT DOCUMENTS

EP 2092646 10/2014
WO 2008039766 4/2008

OTHER PUBLICATIONS

Kobachai Dejhan et al. "A Design of Four-Quadrant Analog Multiplier." International Symposium on Communications and Information Technologies 2004. (ISCIT 2004). Sapporo, Japan, Oct. 26-29, 2004, pp. 29-32.

(Continued)

*Primary Examiner* — Adam D Houston
(74) *Attorney, Agent, or Firm* — John R. Pessetto; Charles A. Brill; Frank D. Cimino

(57) ABSTRACT

A full quadrant analog interpolator used in a fractional clock generator. A quadrature clock signal with minimal jitter is provided to the full quadrant analog interpolator. The full quadrant analog interpolator uses a series of switches and current sources to develop a differential output signal based on a digital input value, thus allowing digital control of the delay developed by the full quadrant analog interpolator. The differential output of the full quadrant analog interpolator is provided to multi-stage comparator. The output of the multi-stage comparator is provided to an integer divider to provide the final output clock. A digital control section utilizes a ΣΔ modulator and a summer to utilize an input N.α control input which provides the desired fractional division amount to provide a signal to a phase accumulator. The output of the phase accumulator is the digital control or β value of the full quadrant analog interpolator.

20 Claims, 9 Drawing Sheets

(56) References Cited

U.S. PATENT DOCUMENTS

| | | | |
|---|---|---|---|
| 6,794,913 B1* | 9/2004 | Stengel | H03L 7/0814 327/158 |
| 7,365,580 B2 | 4/2008 | Martin et al. | |
| 7,602,254 B2* | 10/2009 | Sandner | H03L 7/23 327/147 |
| 7,899,422 B1 | 3/2011 | Teo et al. | |
| 8,561,352 B2 | 10/2013 | Agrawal et al. | |
| 9,667,236 B1 | 5/2017 | Cho et al. | |
| 10,050,634 B1* | 8/2018 | Zhao | H03L 7/0891 |
| 2004/0232995 A1* | 11/2004 | Thomsen | H03L 1/022 331/2 |
| 2004/0232997 A1* | 11/2004 | Hein | H03L 1/022 331/16 |
| 2006/0119402 A1* | 6/2006 | Thomsen | H03L 7/0898 327/105 |
| 2010/0056201 A1* | 3/2010 | Akamine | H04B 1/0017 455/552.1 |
| 2012/0235717 A1* | 9/2012 | Hirai | H03L 7/0891 327/156 |
| 2012/0319749 A1* | 12/2012 | Thaller | H03L 7/183 327/158 |
| 2013/0147531 A1* | 6/2013 | Lee | H03L 7/085 327/158 |
| 2014/0198830 A1* | 7/2014 | Sen | H04L 25/0204 375/150 |
| 2015/0229317 A1* | 8/2015 | Juneau | H03L 7/18 327/105 |
| 2016/0061972 A1* | 3/2016 | Laine | G01V 1/223 367/14 |
| 2016/0191284 A1* | 6/2016 | Izawa | H04B 15/04 375/375 |
| 2016/0211855 A1* | 7/2016 | Unruh | H03L 7/1974 |
| 2016/0226443 A1* | 8/2016 | Caffee | H03B 5/1234 |
| 2018/0278259 A1* | 9/2018 | Ii | G01C 19/5776 |
| 2019/0131983 A1* | 5/2019 | Jain | H03L 7/1976 |

OTHER PUBLICATIONS

Pitpat Prommee et al. "CMOS Wide-Range Four-Quadrant Analog Multiplier Circuit." Proceedings fo 2005 International Symposium on Intelligent Signal Processing and Communications Systems. Dec. 13-16, 2005. Hong Kong, pp. 197-200.

Renesas. "HA-2556 57MHz, Wideband, Four Quadrant, Voltage Output Analog Multiplier." Datasheet, FN2477, Rev 7.00, Apr. 25, 2013, pp. 1-18.

Chaiwat Sakul and Kajornsak Pongthana. "A Low Voltage Supply Four-Quadrant Analog Multiplier Circuit." 2009 International Symposium on Intelligent Signal Processing and Communication Systems (ISPACS 2009). Dec. 7-9, 2009, pp. 292-294.

Ky-Anh Tran. "A Spread-Spectrum Clock Generator Using Phase Interpolation for EMI Reduction." Masters Thesis submitted to MIT Department of Electrical Engineering and Computer Science, Jun. 2014, pp. 1-125.

Hong-wei Wang et al. "High Speed CMOS Digital-to-Analog Converter With Linear Interpolator." IEEE Transactions on Consumer Electronics, vol. 46, No. 4, Nov. 2000, pp. 1137-1142.

International Search Report in corresponding PCT Application No. PCT/US2018/058506, dated Apr. 11, 2019 (2 pages).

* cited by examiner

FRACTIONAL CLOCK GENERATOR

CROSS REFERENCE TO RELATED APPLICATIONS

This application claims priority benefit of India provisional application no. 201741038586, filed Oct. 31, 2017 and entitled "Fractional Clock Generator," the contents of which are entirely incorporated by reference herein.

BACKGROUND

1. Field

The field is clock generators for electronic systems.

2. Description of the Related Art

Modern hardware designs use a variety of complex integrated circuits. The scale of hardware components used vary widely. Some of the components are digital processors (microcontrollers, microprocessors, co-processors, network processors, graphics processors), Application Specific Integrated Circuits (ASICs), Field Programmable Gate Array (FPGA), memory, etc. Diverse frequencies with different noise/jitter tolerances are required to clock these components.

In such a system, a clock is sourced from a universal clock oscillator, mostly a crystal oscillator. In some cases, Bulk-Acoustic Wave (BAW) oscillators as well as other clock sources are also used. Due to the physical nature of these oscillators, a particular clock frequency can be generated, such as 19.2 MHz, 25 MHz, 40 MHz, etc. However, the components need various frequencies which may not be generated from a single source using integer divisor. In most of the cases, a fractional phase locked loop (PLL) is used to generate these frequencies.

The output generated from these PLLs are in a range of a few GHz (e.g., 2 GHz-15 GHz). Generally, the output frequency is divided by a channel divider with an integer division value. It is more likely that the output frequencies are not integer-related or a very high voltage controlled oscillator (VCO)/PLL frequency is needed. The least common multiple of the various clock domains could be very high. It is impractical to generate very high clock frequencies. In such cases, multiple PLLs are incorporated into the system.

Using multiple PLLs in the same chip to generate non-related output frequencies has its own drawbacks. Apart from the power penalty in running individual PLLs, crosstalk between these PLLs would impact the frequency accuracy of the output. Most of these systems need better than 1 ppb (parts per billion) frequency accuracy. One name for this behavior is known as frequency pulling. Similar behavior is observed when multiple ICs having individual PLL share a common supply.

SUMMARY

A full quadrant analog interpolator is used in a fractional clock generator to avoid the need for multiple PLLs, either primary or secondary, reducing power consumption and channel crosstalk. A quadrature clock signal with minimal jitter is provided to the full quadrant analog interpolator. The full quadrant analog interpolator uses a series of switches and current sources to develop a differential output signal based on a digital input value, thus allowing digital control of the delay developed by the full quadrant analog interpolator. The differential output of the full quadrant analog interpolator is provided to multi-stage comparator. Utilizing a multi-stage comparator allows the gain of each stage to be set at a level that minimizes delay dispersion due to capacitive non-linearities. The output of the multi-stage comparator is provided to an integer divider to provide the final output clock. A digital control section utilizes a $\Sigma\Delta$ modulator and a summer to utilize an input N.α control input which provides the desired fractional division amount to provide a signal to a phase accumulator. The output of the phase accumulator is the digital control or β value of the full quadrant analog interpolator.

BRIEF DESCRIPTION OF THE FIGURES

For a detailed description of various examples, reference will now be made to the accompanying drawings in which.

DETAILED DESCRIPTION OF THE EXAMPLES

Figure 1:
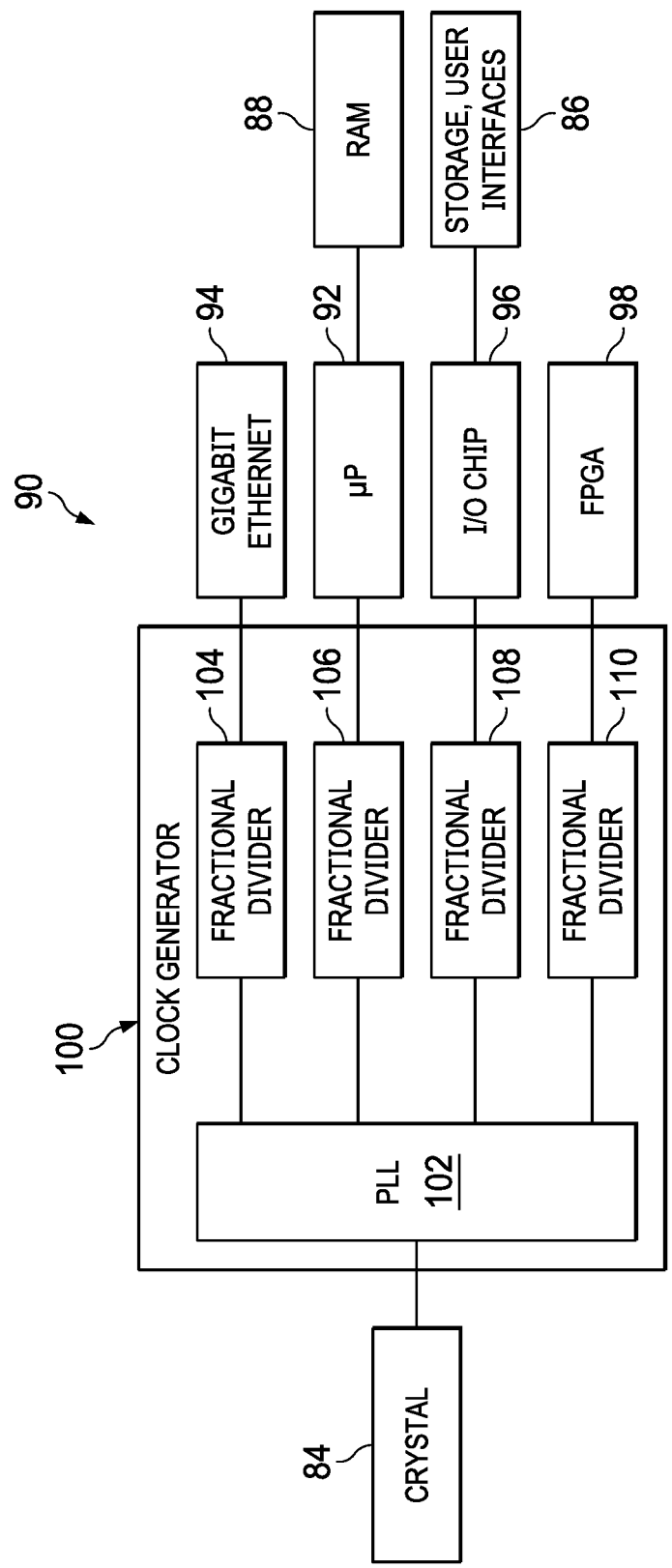
FIG. 1 is a block diagram of a first example of clock generator.

Referring now to FIG. 1, one example of a computer 90 (or other type of electronic system) with a clock generator 100 is shown. A crystal 84 or other clocking source provides an input clock to a PLL 102. The PLL 102 develops an output at a desired frequency, such as 2.5 GHz, and has four outputs providing the output clock frequency to four different fractional clock dividers 104, 106, 108, 110. In the example of FIG. 1, fractional clock divider 104 is connected to a Gigabit Ethernet module 94, fractional clock divider 106 is connected to a microprocessor 92, fractional clock divider 108 is connected to an input/output (I/O) chip 96 and fractional clock divider no is connected to an FPGA 98. The microprocessor 92 is connected to RAM 88, while the I/O chip 96 is connected to storage, user interface devices and the like 86. The output frequency to each fractional clock divider 104, 106, 108, 110 could be different as each could be developed by a different divide-by-N or integer divider located in the PLL 102. For example the output of fractional clock divider 104 could be 125 MHz, the output of fractional clock divider 106 could be 66.66 MHz, the output of fractional clock divider 108 could be 75 MHz and the output of fractional clock divider no could be 100 MHz. In this example, the outputs of fractional clock dividers 106 and 108 are not integer multiples of 2.5 GHz, requiring fractional division. Generally at least one fractional clock divider 104, 106, 108, no receives a clocking signal whose frequency is not a simple integer multiple of the frequency of the fractional clock divider's 104, 106, 108, no output signal, thus requiring a fractional division to occur.

Figure 2:
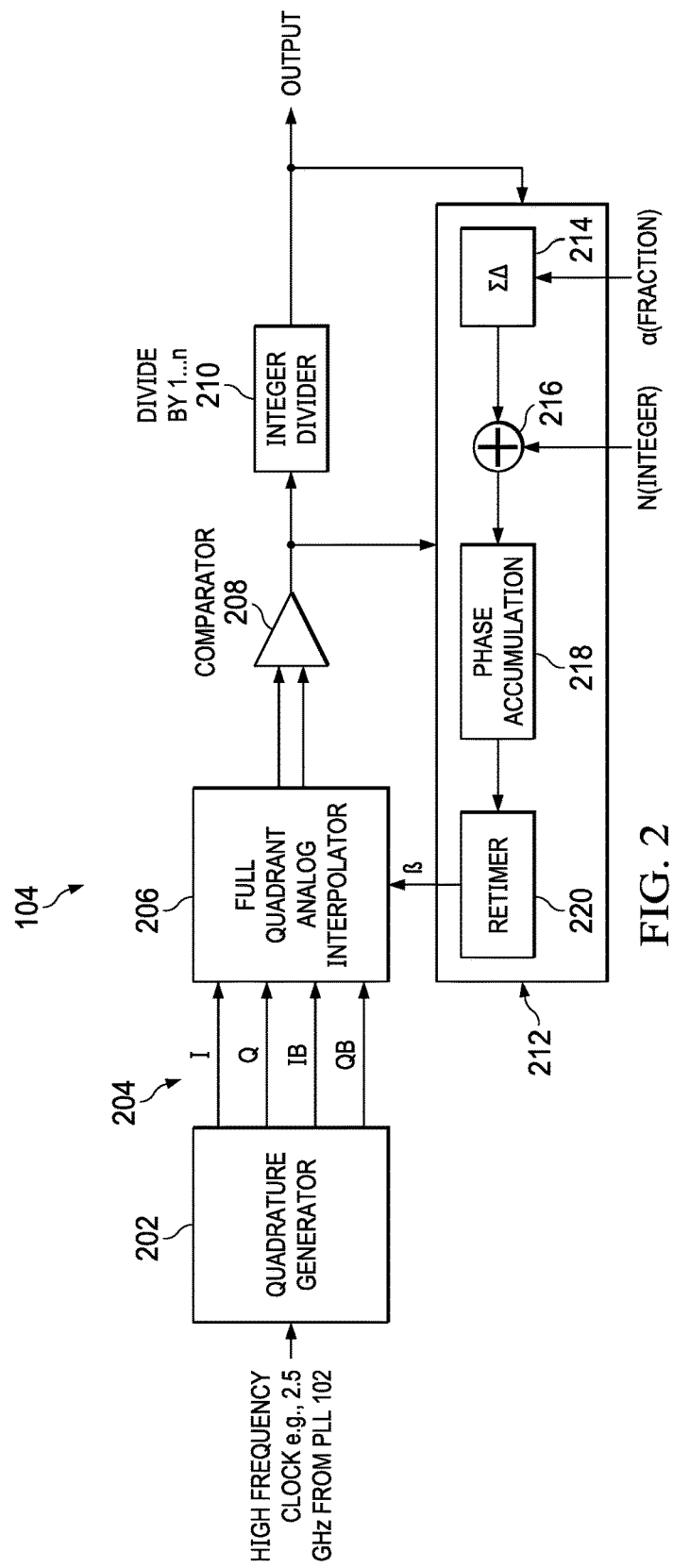
FIG. 2 is a block diagram of the fractional generator of FIG. 1.

Referring to FIG. 2, a block diagram of the fractional clock divider 104 is shown. The clock signal from the PLL 102 is provided to a quadrature generator 202. The quadrature generator 202 provides a four phase clocking signal 204 to a full quadrant analog interpolator 206. The four phases of the clock 204 are referred to as I, Q, IB and QB. Differential outputs of the full quadrant analog interpolator 206 are provided to a comparator 208. The output of the comparator 208 is provided to an integer divider 210. The output of the integer divider 210 is the output of the fractional clock divider 104.

The output of the comparator 208 and the output of the integer divider 210 are provided to a digital control unit 212. The desired clocking signal, either the output of the comparator 208 or the output of the integer divider 210, is used to drive elements in the digital control unit 212. A sigma-delta ($\Sigma\Delta$) modulator 214 receives the a or fractional portion of the desired frequency division. The output of the $\Sigma\Delta$ modulator 214 is provided to an adder 216, along with the N or integer portion of the desired frequency division. The output of the adder 216 is provided to a phase accumulator 218. The phase accumulator 218 digitally accumulates the phase delay needed for the operation. The output of the accumulator is the $\beta$ or digital control value to be provided to the full quadrant analog interpolator 206. However, as the phase accumulator 218 is running on a different clock than the full quadrant analog interpolator 206, a retimer 220 is used to synchronize the $\beta$ value to the full quadrant analog interpolator 206. The full quadrant analog interpolator 206 then produces an analog output value based on the $\beta$ value, which is converted to a square wave by the comparator 208 and then divided down by the integer divider 210 for the output frequency.

Figure 3:
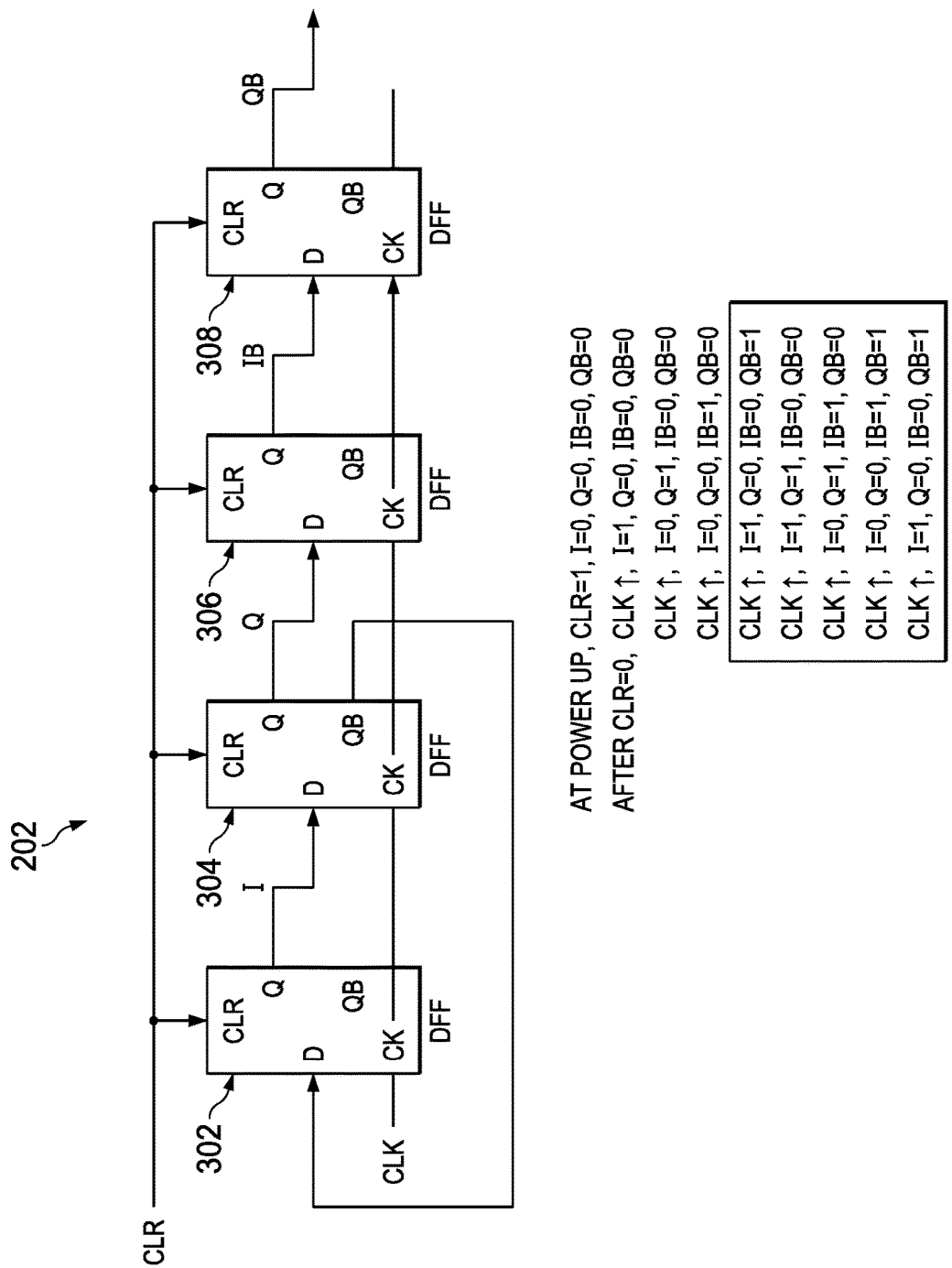
FIG. 3 is a block diagram of quadrature generator of FIG. 2.
Figure 4:
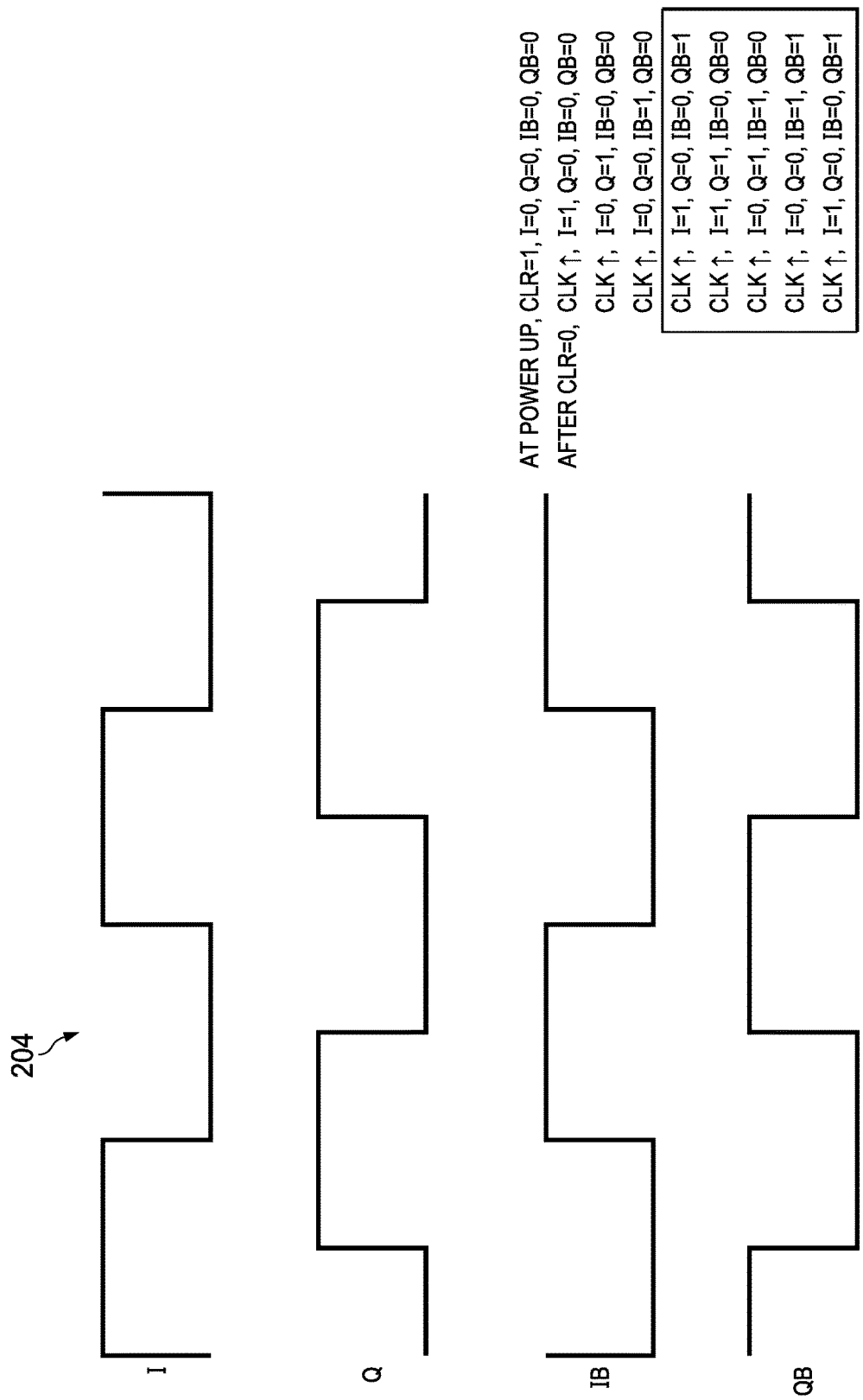
FIG. 4 is a timing diagram of the quadrature generator of FIG. 3.

It is to be noted that the I, Q, IB and QB signals act as clock sources to the full-quadrant analog interpolator 206. Any error in the phase relation between the I, Q, IB and QB signals introduces cycle jitter at the output, which may look like a spurious tone. Details of one example of the quadrature generator 202 are provided in FIG. 3. Four D-type flip-flops 302, 304, 306 and 308 are used. All four D-type flip-flops 302, 304, 306, 308 receive a common clear signal which is active on power up to reset the flip-flops. All four D-type flip-flops 302, 304, 306, 308 are clocked by the same clock signal, the output of the PLL 102. The first D-type flip-flop 302 provides its non-inverting output to D input of the D-type flip-flop 304. The QB or inverted output of the D-type flip-flop 304 is returned to the D input of the D-type flip-flop 302. The Q or non-inverted output of the D-type flip-flop 304 is provided to the D input of the D-type flip-flop 306. The non-inverted output of the D-type flip-flop 2306 is provided to the D input of the D-type flip-flop 308. The non-inverted output each D-type flip-flop 302, 304, 306 and 308 form the I, Q, IB and QB outputs of quadrature clock 204, respectively, of the quadrature generator 202, as shown in FIG. 4. The resulting quadrature clocking signals have the I or first clocking signal and its inverse the IB or third clocking signal and the Q or second clocking signal and its inverse the QB or fourth clocking signal.

D-type flip-flops 302 and 304 form a 2-bit Johnson counter. At power-up, this 2-bit counter is reset to "oo". D-type flip-flops 306 and 308 form a barrel shifter. The state machine transitions of the D-type flip-flops 302, 304, 306 and 308 are shown in the table in FIG. 3. The clock to Q delay of all four phases are aligned and limited by device and parasitic mismatch, so phase relation errors are minimized and can be readily corrected.

Figure 5:
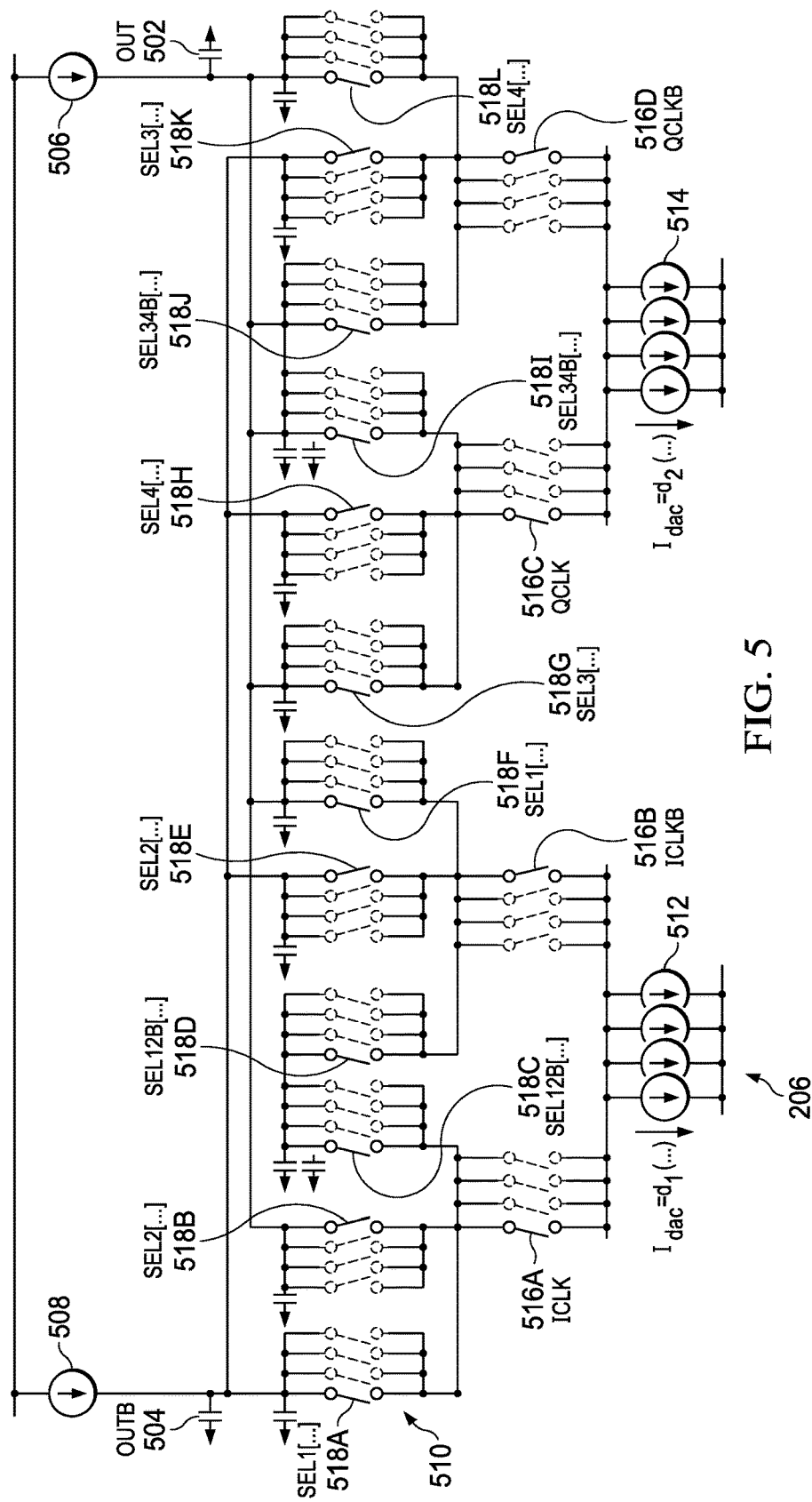
FIG. 5 is a block diagram of the full quadrant multiplier of FIG. 2.

The generated quadrature clock is provided to the full quadrant analog interpolator 206. An analog interpolator is a circuit which introduces digital-controlled delay (in finer steps) from input to the output. One example of the full quadrant analog interpolator 206 is shown in FIGS. 5 and 6, where FIG. 6 is an enlarged version of the left portion of FIG. 5.

The differential outputs OUT and OUTB are provided from capacitors 502 and 504, respectively. Each capacitor 502, 504 acts as an integrator of the current provided to the differential pair formed by current source 506 and current source 508. A series of sets of switches 510 are provided between the capacitors 502 and 504 and two current source sets 512 and 514, current source set 512 relating to clock signals I and IB and current source set 514 relating to clock signals Q and QB.

Figure 6:
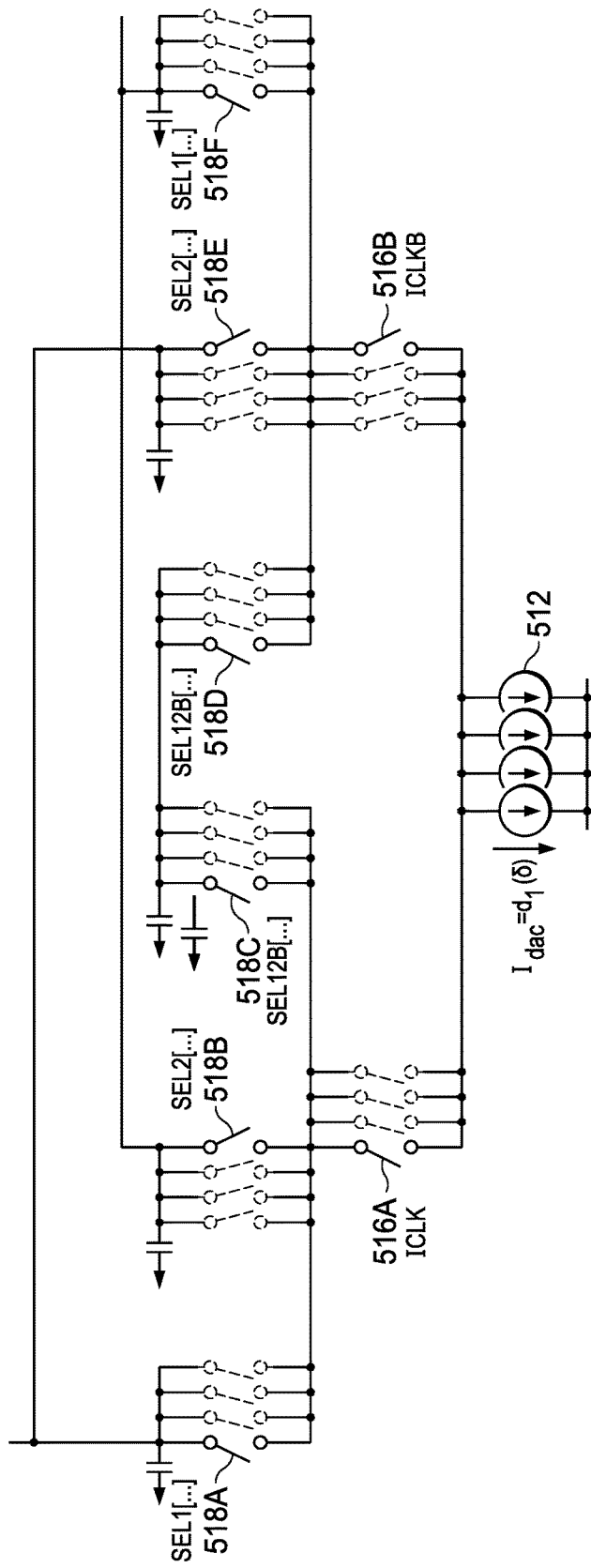
FIG. 6 is an enlarged view of a portion of the full quadrant multiplier of FIG. 5.

Referring to FIG. 6, it becomes clear that each set of switches 510 is four switches in parallel and that each illustrated current source set 512 is four equally weighted current sources in parallel. The example of FIGS. 5 and 6 is a two bit example for ease of description corresponding to a three bit $\beta$, with actual units being, for example, 8, 10 or 12 bits, thus having $2^8$, $2^{10}$ or $2^{12}$ switches and current sources in parallel, with corresponding 9, 11 or 13 bit $\beta$ values. The number of bits defines the resolution or number of steps of the full quadrant analog interpolator 206.

Four switches are provided for each quadrature clock signal, resulting in ICLK switches 516A for the I quadrature clock, ICLKB switches 516B for the IB quadrature clock, QCLK switches 516C for the Q quadrature clock and QCLKB switches 516D for the QB quadrature clock. The ICLK switches 516A and the ICLKB switches 516B are connected to the current source set 512, while the QCLK switches 516C and the QCLKB switches 516D are connected to the current source set 514.

Select (SEL) sets of switches are connected between the quadrature clocking sets of switches and the capacitors 502 and 504. The SEL sets of switches are related to the various quadrants of the full quadrant analog interpolator 206. For example, SEL1 sets of switches relate to quadrant one, SEL2 sets of switches relate to quadrant two, SEL3 sets of switches relate to quadrant three and SEL4 sets of switches relate to quadrant four. Each SEL value is illustrated as being a four-bit value. Thus SEL1[ ] means SEL1 bits 0-3, SEL2[ ] means SEL2 bits 0-3, SEL3[ ] means SEL3 bits 0-3, and SEL4[ ] means SEL4 bits 0-3. SEL12B[ ] means the NAND of SEL1[ ] and SEL2[ ], and thus relates to not being in quadrants one or two, and SEL34B[ ] means the NAND of SEL3[ ] and SEL4[ ] and thus relates to not being in quadrants three or four.

SEL1[ ] switches 518A are connected between the ICLK switches 516A and the capacitor 504. SEL2[ ] switches 518B are connected between the ICLK switches 516A and the capacitor 502. SEL12B[ ] switches 518C are connected between the ICLK switches 516A and a virtual node. SEL12B[ ] switches 518D are connected between the ICLKB switches 516B and the virtual node. SEL2[ ] switches 518E are connected between the ICLKB switches 516B and the capacitor 504. SEL1[ ] switches 518F are connected between the ICLKB switches 516B and the capacitor 502. SEL3[ ] switches 518G are connected between the QCLK switches 516C and the capacitor 502. SEL4[ ] switches 518H are connected between the QCLK switches 516C and the capacitor 504. SEL34B[ ] switches 518I are connected between the QCLK switches 516C and the virtual node. SEL34B[ ] switches 518J are connected between the QCLKB switches 516D and the virtual node.

SEL3[ ] switches 518K are connected between the QCLKB switches 516D and the capacitor 504. SEL4[ ] switches 518L are connected between the QCLKB switches 516D and the capacitor 502.

The number of individual current sources in the current source sets 512, 514 act as a weight of the clock source in the differential pair formed by integrating capacitors 502, 504. As the weights of the clocks are changed, based on the SEL values, the input-output delay of the full quadrant analog interpolator 206 changes. The SEL values are used to set the phase shift of the full quadrant analog interpolator 206, which equates to the input-output delay.

The input β values, related phase shift values and the resultant SEL values are provided in Table 1.

TABLE 1

| β | SEL1 (b) | SEL2 (b) | SEL3 (b) | SEL4 (b) | Phase delay (°) |
|---|---|---|---|---|---|
| 000 | 1111 | 0000 | 0000 | 0000 | 0 |
| 001 | 0011 | 0000 | 0000 | 1100 | 45 |
| 010 | 0000 | 0000 | 0000 | 1111 | 90 |
| 011 | 0000 | 0011 | 0000 | 1100 | 135 |
| 100 | 0000 | 1111 | 0000 | 0000 | 180 |
| 101 | 0000 | 0011 | 1100 | 0000 | 225 |
| 110 | 0000 | 0000 | 1111 | 0000 | 270 |
| 111 | 0011 | 0000 | 1100 | 0000 | 315 |
| 000 | 1111 | 0000 | 0000 | 0000 | 360/0 |

The operation of the full quadrant analog interpolator 206 is as follows:

In the example, each current source set 512, 514 is divided into four equally weighted current sources. The desired input-output delay or phase delay is 327.5°. This delay equates to a need to interpolate between ICLK and QLK with 0.25 weight on ICLK and 0.75 weight of QCLK. This transforms into one out of 4 switches of the SEL1 switches 518A would be ON or closed, to provide the 0.25 weight on ICLK. Similarly, one out of 4 switches of the SEL1 switches 518F would be ON. All SEL2 switches 518B and 518E connected to ICLK switches 516A and ICLKB switches 516B would be OFF. Then 3 out of 4 switches of SEL12B switches 518C and 518D would be ON, shunting ¾ of the current into the virtual node. For QCLK, 3 out of 4 switches of SEL4 switches 518H and 518L would be ON. All SEL3 switches 518G and 518K would be OFF. One out of four switches of SEL34B switches 518I and 518J would shunt unused current into virtual node.

Mathematically, the value of SEL1 is multiplied with the value of a current source of current source set 512 and summed with the multiplication of the value of SEL4 with the value of a current source in the current source set 514. This is referred to as in-phase addition. Similar operation is possible for QCLK-IBCLK, IBCLK-QBCLK and QBCLK-ICLK pair by selecting appropriate MUX pairs of the SEL switches 518.

In the illustrated example of the full quadrant analog interpolator 206, the current density of each of the switch sets, both SEL switch sets 518 and quadrature clock switch sets 516, is constant with SEL code. As a result, the non-linearity arising from the voltage swing on non-linear capacitors is minimized or eliminated. Since the output of the full quadrant analog interpolator 206 is fully-differential, good power supply rejection ratio (PSRR) is also provided.

The fully-differential output of the full quadrant analog interpolator 206 needs to be converted into CMOS levels for further processing. The amplitude of the output of the full quadrant analog interpolator 206 changes with the fractional-code value. The delay of a comparator is dependent upon the input over-drive. If the delay of the comparator changes with code, that would give rise to additional non-linearity. The best known method to mitigate this non-linearity is to increase the gain-bandwidth of the comparator, but there is huge power penalty with this method. A calibration technique can also be used to pre-empt the delay from the comparator and pre-distort the digital-delay control of the interpolator, but this method has its own drawbacks. The delay non-linearity of the comparator, also known as delay dispersion, should be minimized with lowest power consumption. One of the primary reasons for delay dispersion is the voltage slew on intermediate nodes with a non-linear capacitor. The total current integrated at the output node of the capacitor would depend upon how fast did the non-linear capacitors swing, as well as the voltage swing. By controlling the swing on the non-linear nodes and high-swing nodes, there is a reduction or minimization of the delay dispersion of the comparator.

Figure 7:
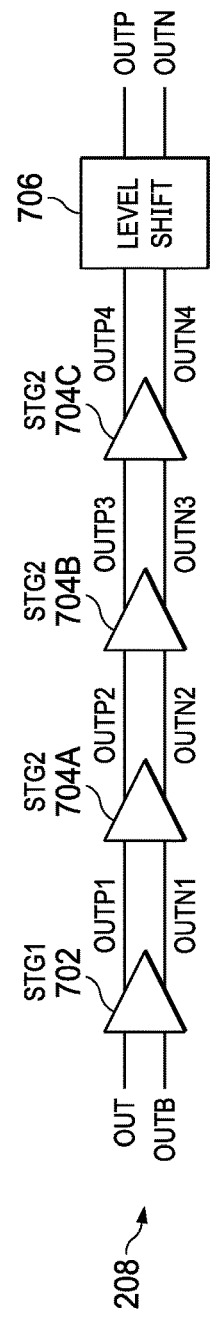
FIG. 7 is a block diagram of the comparator of FIG. 2.

One example comparator 208 architecture is shown in FIG. 7. The comparator 208 is formed by multiple stages of a high-speed comparator, for example, an input stage STG1 702, three gain stages STG2 704A, 704B and 704C, and a level shift 706. Not shown in FIG. 7 for simplicity are the generation of the standard current and voltage biases for input stage STG1 702. In one example the OUT and OUTB signals from the full quadrant analog interpolator 206 are AC coupled to the input stage STG1 702. In one example, for input stage STG1 702 class AB biasing is used. Ratiometric sizes of NMOS and PMOS transistors along with load resistor are used to define DC current through input stage STG1 702 which is proportional to the bias currents of the input stages of the comparator 208. By AC coupling, low frequency noise and DC common mode from the full quadrant analog interpolator 206 are rejected. The input stage STG1 702 acts as a differential slicer and resembles a transconductance-capacitor (GM-C) comparator stage.

Figure 7A:
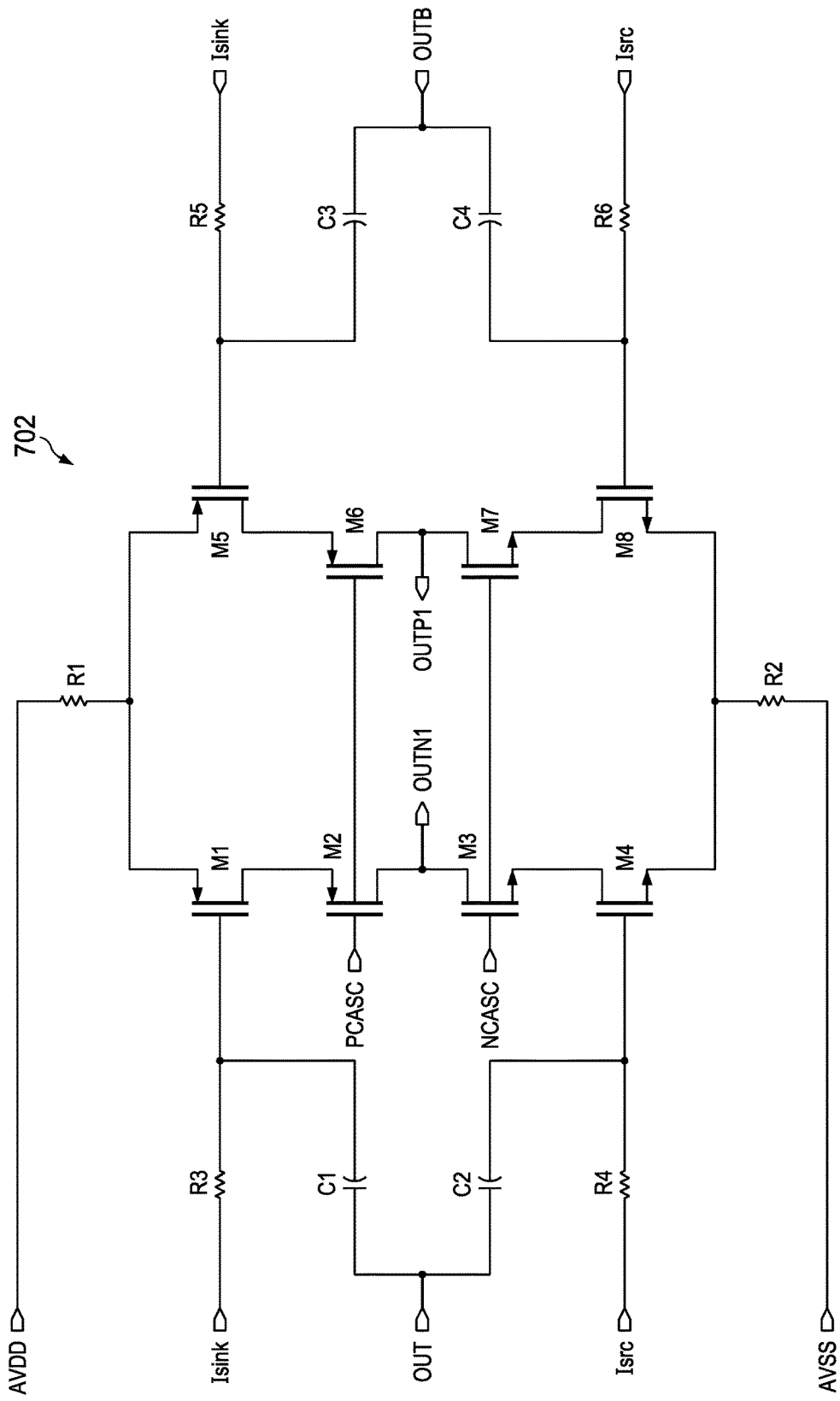
FIG. 7A is a block diagram of input STG1 of FIG. 7.

Details of an example of input stage STG1 702 are provided in FIG. 7A. Input stage STG1 702 in this example includes transistors M1-M8, resistors R1-R6, and capacitors C1-C4. Transistors M1, M2, M5, and M6 comprise p-type metal oxide semiconductor field effect transistors (PMOS), while transistors M3, M4, M7, and M8 comprise n-type metal oxide semiconductor field effect transistors (NMOS). Other types of transistors can be used to implement each of M1-M8 including oppositely doped transistors from those shown as well as bipolar junction transistors. Transistor M2 The sources of M1 and M5 are connected together and to resistor R1, which in turn is connected to a positive power supply voltage node (AVDD). The drain of M1 connects to the source of M2. The drain of M2 connects to the drain of M3, and the source of M3 connects the drain of M4. Similarly, the drain of M5 connects to the source of M6, the drain of M6 connects to the drain of M7, and the source of M7 connects the drain of M8. The sources of M4 and M8 are connected together and to resistor R2, which in turn connects to a negative power supply voltage node (AVSS). The node interconnecting M2 and M3 represents the OUTN1 output of the input stage STG1 702 and the node interconnecting M6 and M7 represents the OUTP1 output to the next stage STG2. Transistors M1-M8 and resistors R1 and R2 are configured as an H-bridge circuit. When OUT is low (and thus OUTB is high), M1 and M8 are turned on and thus OUTN1 is high and OUTP1 is low. Conversely, when OUT is high (and thus OUTB is low), M5 and M4 are turned on and thus OUTN1 is low and OUTP1 is high.

Transistor M2 is connected to M1 in a cascode configuration. Similarly, each of transistors M6, M3 and M7 is also connected to corresponding transistor M5, M4, and M8 in a cascode configuration. The gates of M2 and M6 are biased by way of a common voltage pcasc as shown in FIG. 7A, and the gates of M3 and M7 are biased by way of a common voltage ncasc.

The OUT input to input stage STG1 connects to both capacitors C1 and C2. The OUTB input to input stage STG1 connects to both capacitors C3 and C4. The gate voltage for M1 is the voltage on the node interconnecting C1 and R3. The gate voltage for M4 is the voltage on the node interconnecting C2 and R4. The gate voltage for M5 is the voltage on the node interconnecting C3 and R5, and the gate voltage for M8 is the voltage on the node interconnecting C4 and R6. Current source devices (not shown) inject a constant current into the nodes labelled Isrc and Isink to set DC voltages. Capacitors C1, C2, C3 and C4 provide AC coupling from the full quadrant analog interpolator 206 to the comparator 208. Capacitors C1, C2, C3 and C4 in conjunction with resistors R3, R4, R5 and R6 for high pass filters to improve the voltage headroom of the comparator 208.

Figure 7B:
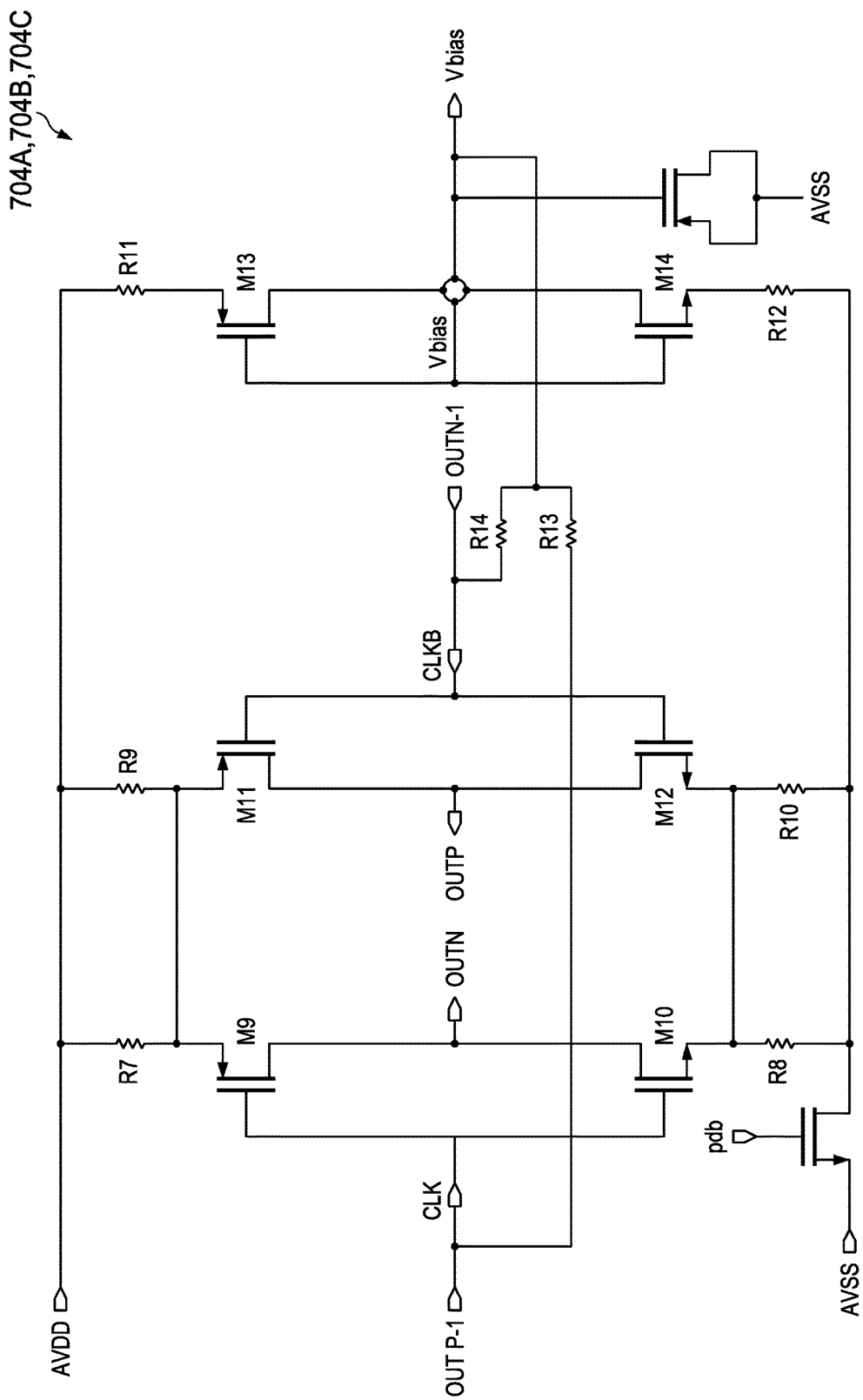
FIG. 7B is a block diagram of gain stage STG2 of FIG. 7.

FIG. 7B shows an example of a circuit usable to implement any of gain stages STG2 704A, 704B and 704C. The signals labelled CLK and CLKB are the inputs. For example, for gain stage STG2, CLK and CLKB represent OUTP1 and OUTN1 from input stage STG1 702. The nodes in FIG. 7B labelled OUTP and OUTN are the outputs of the stage (e.g., OUTP2 and OUTN2 for gain stage STG2). Transistors M9-M12 along with resistors R7-R10 are configured as an H-bridge circuit with OUTP being the voltage on the node interconnecting the drains of M11 and M12 and OUTN being the voltage on the node interconnecting the drains of M9 and M10. In this example, transistors M9 and M11 are PMOS devices and transistors M10 and M12 are NMOS devices. Transistor is biased on by voltage pdb. When CLK is low (and thus CLKB is high), M9 and M12 are turned on and thus OUTN is high and OUTP is low. Conversely, when CLK is high (and thus CLKB is low), M10 and M11are turned on and thus OUTN is low and OUTP is high.

Resistor R11 PMOS transistor M13, NMOS transistor M14 and resistor R12 are a replica of resistor R9, PMOS transistor M11, NMOS transistor M12 and resistor R10 and provide a Vbias signal used to bias the output of the prior gain stage STG1 702 or STG2 704A or 704B. The Vbias signal is provided to resistors R13 and R14, connected to the outputs OUTP and OUTN from the prior gain stage STG1 702 or STG2 704A or 704B.

To limit the output from input stage STG1 702 without sacrificing overall comparator gain, three gain stages STG2 704A, 704B, 704C are used. The gain stages STG2 704A, 704B, 704C are DC coupled to the previous stage. The use of three gain stages STG2 allows the gain of each stage to be reduced to limit the amplitude swing at each stage to reduce delay dispersion. At the output of final gain stage STG2 704C, the gain is high enough to so that the level shift 706 which provides the output of the comparator 208 is a simple inverter gain stage to restore CMOS levels. Being at CMOS levels, the output of the comparator 208 can simply be provided to an integer divider 210, if needed, and can be provided to the digital control unit 212, if the output of the integer divider 210 is not to be used by the digital control unit 212.

Figure 7C:
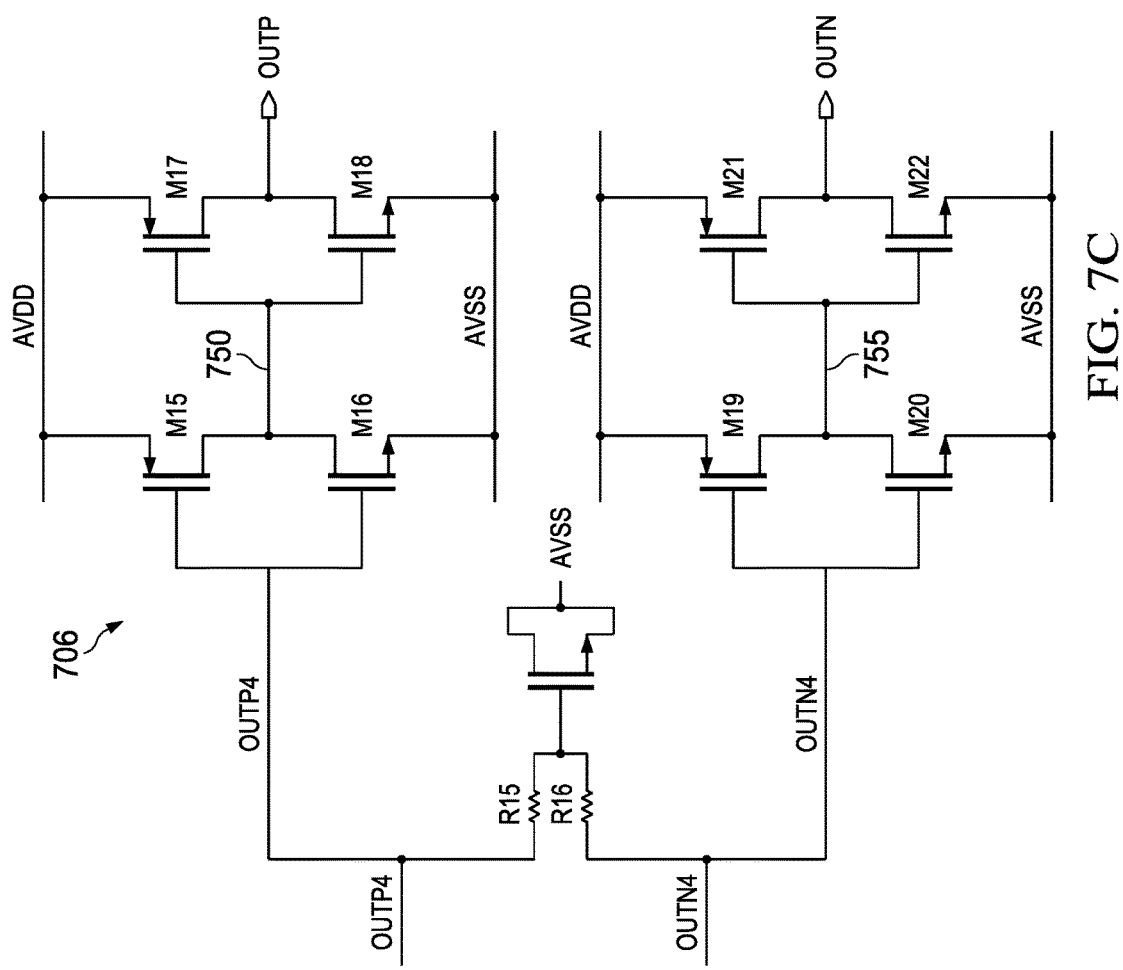
FIG. 7c is a block diagram of the level shifter of FIG. 7.

FIG. 7C shows an example of level shift 706. The illustrative level shift 706 includes transistors M15-M22. Transistors M15 and M16 are connected to form an inverter and transistors M17 and M18 form another inverter. The output 750 from the inverter comprising M15/M16 represents the input to the next inverter comprising M17/M18. Thus, the output OUTP is of the same logical state (high or low) as the input OUTP4 but is level shifted to be either AVDD or AVSS (less the drain-to-source voltage of M17 or M18).

Similarly, transistors M19 and M20 are connected to form an inverter and transistors M21 and M22 form another inverter. The output 755 from the inverter comprising M21/M22 represents the input to the next inverter comprising M21/M22. Thus, the output OUTN is of the same logical state (high or low) as the input OUTN4 but is level shifted to be either AVDD or AVSS (less the drain-to-source voltage of M21 or M22).

Resistors R15 and R16 are connected to AVSS and the OUTP4 or OUTN4 signals provided as the output of the gain stage 704C for bias purposes similar to resistors R13 and R14.

The desired fractional frequency division value is represented as a value $N.\alpha$, with N being the integer portion of the digital fractional division value and $\alpha$ being the digital fractional or residual division value. For example, if the input frequency is 1 GHZ and the desired output frequency is 100.1 MHz, this represents a frequency division of 9.999. The value of the integer divider 210 is 10. Therefore, $N.\alpha$ is 0.999000999. Converting this value to a 25 bit binary value results in 0.1111 1111 1011 1110 1000 0111. If $2^{12}$ switches are used in each set of SEL switches, then the top 13 bits are the N value and the lower 12 bits form the $\alpha$ value. This results in a decimal $N.\alpha$ value of 4091.907958984375. The $\alpha$ or fractional value is provided to the $\Sigma\Delta$ modulator 214, which then provides a 1 output approximately nine out of every 10 clock periods. This output of the $\Sigma\Delta$ modulator 214 is summed with the N value, in the example a value of 4091, so that approximately nine out of every tenth clocks the output of the adder 216 is 4092, the other clock cycles the output being a 4091 value. The output of the adder 216 is provided to the phase accumulator 218 as the increment or jump size of the phase accumulator 218. The output of the phase accumulator 218 is the $\beta$ value used to develop the next SEL1[ ], SEL2[ ], SEL3[ ] and SEL4[ ] values to be used by the full quadrant analog interpolator 206. As noted above, the values are provided from the phase accumulator 218 to the full quadrant analog interpolator 206 through a retimer 220 because of clock domain issues.

The use of the full quadrant analog interpolator allows the development of a fractional clock without the need for multiple PLLs, either primary or secondary, reducing power consumption and channel crosstalk. A quadrature clock signal with minimal jitter is provided to the full quadrant analog interpolator. The full quadrant analog interpolator uses a series of switches and current sources to develop a differential output signal based on a digital input value, thus allowing digital control of the delay developed by the full quadrant analog interpolator. The differential output of the full quadrant analog interpolator is provided to multi-stage comparator. Utilizing a multi-stage comparator allows the gain of each stage to be set at a level that minimizes delay dispersion due to capacitive non-linearities and minimizes the power used as compared to a single stage comparator of equivalent gain-bandwidth. The output of the multi-stage comparator is provided to an integer divider to provide the final output clock. A digital control section utilizes a $\Sigma\Delta$ modulator and a summer to utilize an input $N.\alpha$ control input which provides the desired fractional division amount to provide a signal to a phase accumulator. The output of the phase accumulator is the digital control or $\beta$ value of the full quadrant analog interpolator.

The above description is intended to be illustrative, and not restrictive. For example, the above-described examples may be used in combination with each other. Many other examples will be apparent upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A fractional clock divider comprising:
   a full quadrant analog interpolator having inputs to receive a clock signal and digital control value and having an output;
   a comparator having an input connected to the full quadrant analog interpolator output and having an output;
   an integer divider having an input connected to the comparator output and an output providing the divided clock signal; and
   a digital control unit having an input receiving a clocking signal and an input receiving a digital fractional division value and having an output connected to the full quadrant analog interpolator digital control value input.

2. The fractional clock divider of claim 1, further comprising:
   a quadrature generator having an input for receiving a clock signal and providing four quadrature clocking signals as outputs, the first and third quadrature clocking signals being inverses and the second and fourth quadrature clocking signals being inverses, the four quadrature clocking signals connected to the clock signal input of the full quadrant analog interpolator.

3. The fractional clock divider of claim 2, wherein the full quadrant analog interpolator includes:
   a first capacitor providing a non-inverting output;
   a second capacitor providing an inverting output;
   a series of sets of switches connected to each of the first and second capacitors, the series comprising two sets of switches for each of four quadrants, one set connected to the first capacitor and one set connected to the second capacitor;
   a series of sets of switches connected to a virtual node, the series comprising two sets of switches for not the first and second quadrants and two sets of switches for not the third and fourth quadrants;
   a series of sets of switches, the series comprising one set of switches for each quadrature clocking signal, wherein
      the set of first quadrature clocking signal switches is connected to the set of switches for the first quadrant connected to the second capacitor, to the set of switches for the second quadrant connected to the first capacitor and to a set of switches for not the first and second quadrants,
      the set of third quadrature clocking signal switches is connected to the set of switches for the first quadrant connected to the first capacitor, to the set of switches for the second quadrant connected to the second capacitor and to a set of switches for not the first and second quadrants,
      the set of second quadrature clocking signal switches is connected to the set of switches for the third quadrant connected to the first capacitor, to the set of switches for the fourth quadrant connected to the second capacitor and to a set of switches for not the third and fourth quadrants, and
      the set of fourth quadrature clocking signal switches is connected to the set of switches for the third quadrant connected to the second capacitor, to the set of switches for the fourth quadrant connected to the first capacitor and to a set of switches for not the third and fourth quadrants; and
   a series of sets of current sources comprising a set of current sources for the first and third quadrature clock signals and a set of current sources for the second and fourth quadrature clock signals, wherein
      the set of current sources for the first and third quadrature clock signals is connected to the set of first quadrature clocking signal switches and the set of third quadrature clocking signal switches, and
      the set of current sources for the second and fourth quadrature clock signals is connected to the set of second quadrature clocking signal switches and the set of fourth quadrature clocking signal switches.

4. The fractional clock divider of claim 1, wherein the comparator is a multi-stage comparator.

5. The fractional clock divider of claim 1, wherein the digital control unit includes:
   a sigma-delta modulator having an input receiving a fractional portion of the digital fractional division value and having an output;
   an adder having inputs to receive the output of the sigma-delta modulator and an integer portion of the digital fractional division value and having an output; and
   a phase accumulator having an input receiving the adder output and having an output providing the full quadrant analog interpolator digital control value.

6. The fractional clock divider of claim 5, wherein the digital control unit is clocked by one of the comparator output and the integer divider output.

7. The fractional clock divider of claim 5, wherein the digital control unit further includes a retimer having an input connected to the output of the phase accumulator and an output connected to the full quadrant analog interpolator digital control value input.

8. A clock generator comprising:
   a phase locked loop having an input for receiving an input clock signal and an output providing an output clock signal; and
   at least one fractional clock divider, each fraction clock divider including:
      a full quadrant analog interpolator having inputs to receive a clock signal based on the output clock signal of the phase locked loop and a digital control value and having an output;
      a comparator having an input connected to the full quadrant analog interpolator output and having an output;
      an integer divider having an input connected to the comparator output and an output providing the divided clock signal; and
      a digital control unit having an input receiving a clocking signal and an input receiving a digital fractional division value and having an output connected to the full quadrant analog interpolator digital control value input.

9. The clock generator of claim 8, each fractional clock divider further including:
   a quadrature generator having an input for receiving the phase locked loop output clock signal and providing four quadrature clocking signals as outputs, the first and third quadrature clocking signals being inverses and the second and fourth quadrature clocking signals being inverses, the four quadrature clocking signals connected to the clock signal input of the full quadrant analog interpolator.

10. The clock generator of claim 9, wherein each full quadrant analog interpolator includes:
   a first capacitor providing a non-inverting output;
   a second capacitor providing an inverting output;
   a series of sets of switches connected to each of the first and second capacitors, the series comprising two sets of switches for each of four quadrants, one set connected to the first capacitor and one set connected to the second capacitor;
   a series of sets of switches connected to a virtual node, the series comprising two sets of switches for not the first and second quadrants and two sets of switches for not the third and fourth quadrants;
   a series of sets of switches, the series comprising one set of switches for each quadrature clocking signal, wherein
      the set of first quadrature clocking signal switches is connected to the set of switches for the first quadrant connected to the second capacitor, to the set of switches for the second quadrant connected to the first capacitor and to a set of switches for not the first and second quadrants,
      the set of third quadrature clocking signal switches is connected to the set of switches for the first quadrant connected to the first capacitor, to the set of switches for the second quadrant connected to the second capacitor and to a set of switches for not the first and second quadrants,
      the set of second quadrature clocking signal switches is connected to the set of switches for the third quadrant connected to the first capacitor, to the set of switches for the fourth quadrant connected to the second capacitor and to a set of switches for not the third and fourth quadrants, and
      the set of fourth quadrature clocking signal switches is connected to the set of switches for the third quadrant connected to the second capacitor, to the set of switches for the fourth quadrant connected to the first capacitor and to a set of switches for not the third and fourth quadrants; and
   a series of sets of current sources comprising a set of current sources for the first and third quadrature clock signals and a set of current sources for the second and fourth quadrature clock signals, wherein
      the set of current sources for the first and third quadrature clock signals is connected to the set of first quadrature clocking signal switches and the set of third quadrature clocking signal switches, and
      the set of current sources for the second and fourth quadrature clock signals is connected to the set of second quadrature clocking signal switches and the set of fourth quadrature clocking signal switches.

11. The clock generator of claim 8, wherein the comparator is a multi-stage comparator.

12. The clock generator of claim 8, wherein the digital control unit includes:
   a sigma-delta modulator having an input receiving a fractional portion of the digital fractional division value and having an output;
   an adder having inputs to receive the output of the sigma-delta modulator and an integer portion of the digital fractional division value and having an output; and
   a phase accumulator having an input receiving the adder output and having an output providing the full quadrant analog interpolator digital control value.

13. The clock generator of claim 12, wherein the digital control unit is clocked by one of the comparator output and the integer divider output.

14. The clock generator of claim 12, wherein the digital control unit further includes a retimer having an input connected to the output of the phase accumulator and an output connected to the full quadrant analog interpolator digital control value input.

15. A method of fractionally dividing a clock comprising the steps of:
   providing a clock signal to a full quadrant analog interpolator having inputs to receive a clock signal and digital control value and having an output;
   digitizing the output of the full quadrant analog interpolator with a comparator having an input connected to the full quadrant analog interpolator output and having an output;
   dividing the output of the comparator with an integer divider having an input connected to the comparator output and an output providing the divided clock signal; and
   controlling the full quadrant analog interpolator with a digital control unit having an input receiving a clocking signal and an input receiving a digital fractional division value and having an output connected to the full quadrant analog interpolator digital control value input.

16. The method of claim 15, further comprising the step of:
   developing a four quadrature clocking signals, the first and third quadrature clocking signals being inverses and the second and fourth quadrature clocking signals being inverses, the four quadrature clocking signals connected to the clock signal input of the full quadrant analog interpolator.

17. The method of claim 16, wherein the full quadrant analog interpolator includes:
   a first capacitor providing a non-inverting output;
   a second capacitor providing an inverting output;
   a series of sets of switches connected to each of the first and second capacitors, the series comprising two sets of switches for each of four quadrants, one set connected to the first capacitor and one set connected to the second capacitor;
   a series of sets of switches connected to a virtual node, the series comprising two sets of switches for not the first and second quadrants and two sets of switches for not the third and fourth quadrants;
   a series of sets of switches, the series comprising one set of switches for each quadrature clocking signal, wherein
      the set of first quadrature clocking signal switches is connected to the set of switches for the first quadrant connected to the second capacitor, to the set of switches for the second quadrant connected to the first capacitor and to a set of switches for not the first and second quadrants,
      the set of third quadrature clocking signal switches is connected to the set of switches for the first quadrant connected to the first capacitor, to the set of switches for the second quadrant connected to the second capacitor and to a set of switches for not the first and second quadrants,
      the set of second quadrature clocking signal switches is connected to the set of switches for the third quadrant connected to the first capacitor, to the set of switches for the fourth quadrant connected to the second capacitor and to a set of switches for not the third and fourth quadrants, and the set of fourth quadrature clocking signal switches is connected to the set of switches for the third quadrant connected to the second capacitor, to the set of switches for the fourth quadrant connected to the first capacitor and to a set of switches for not the third and fourth quadrants; and a series of sets of current sources comprising a set of current sources for the first and third quadrature clock signals and a set of current sources for the second and fourth quadrature clock signals, wherein the set of current sources for the first and third quadrature clock signals is connected to the set of first quadrature clocking signal switches and the set of third quadrature clocking signal switches, and the set of current sources for the second and fourth quadrature clock signals is connected to the set of second quadrature clocking signal switches and the set of fourth quadrature clocking signal switches, and wherein the digital control unit controls the full quadrant analog interpolator by providing digital control values to control the series of sets of switches connected to each of the first and second capacitors and the series of sets of switches connected to a virtual node.

18. The method of claim 15, wherein the comparator is a multi-stage comparator.

19. The method of claim 15, wherein the digital control unit includes:

a sigma-delta modulator having an input receiving a fractional portion of the digital fractional division value and having an output;

an adder having inputs to receive the output of the sigma-delta modulator and an integer portion of the digital fractional division value and having an output; and a phase accumulator having an input receiving the adder output and having an output providing the full quadrant analog interpolator digital control value.

20. The method of claim 19, wherein the digital control unit further includes a retimer having an input connected to the output of the phase accumulator and an output connected to the full quadrant analog interpolator digital control value input.

\* \* \* \* \*